(12) United States Patent
Ellison et al.

(10) Patent No.: US 6,556,342 B1
(45) Date of Patent: Apr. 29, 2003

(54) THULIUM DOPED FIBER PUMP FOR PUMPING RAMAN AMPLIFIERS

(75) Inventors: Adam J Ellison, Corning, NY (US); John D Minelly, Painted Post, NY (US); Bryce N Samson, Horseheads, NY (US); Nicholas J Traynor, Fontainebleau (FR); Donnell T Walton, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/159,173

(22) Filed: May 31, 2002

(51) Int. Cl.[7] .................................................. H01S 3/30
(52) U.S. Cl. .................. 359/334; 359/134; 359/341.31; 372/3; 372/70
(58) Field of Search ................................. 359/134, 160, 359/334, 341.31; 372/3, 70

(56) References Cited

U.S. PATENT DOCUMENTS 5,268,910 A * 12/1993 Huber ............................ 372/6
6,466,363 B1 * 10/2002 Thanman et al. ........... 359/344

FOREIGN PATENT DOCUMENTS

EP          1220 384     * 7/2002

OTHER PUBLICATIONS

Feller et al, CLEO '96, pp 528–529, vol. 9, Conference of Lasers and Electro–Optics, Jun. 7, 1996.*
Bayart, D., LEDS2001, IEEE Lasers & Electro–Optics Soc. 1 vol. 2, pp 411–412, Nov. 13, 2001.*
Samson et al, OSA Trends in Optics & Photonic Series, vol. 44, pp 247–249, Jul. 2000.*
Sakamoto J ; OFC 2001 Opt. Fiber Conn. "S–Bevel Fiber Optic Amplifiers", vol. 2, pp Tug1–TI–4; Mar. 22, 2001.*
Sawchuk AA, OFC 2001, Masum et al., vol. 3, WD 09–W1–3, Mar. 22, 2001.*
Roy et al, OFC 2001, vol. 4, p.p. PD 2–1–3, Mar. 22, 2001.*

* cited by examiner

Primary Examiner—Nelson Moskowitz
(74) Attorney, Agent, or Firm—Svetlana Z. Short

(57) ABSTRACT

An optical transmission system is provided comprising a thulium doped optical fiber, a light emitting pump device optically coupled to the thulium doped fiber, and a Raman amplifier fiber optically coupled to the thulium doped optical fiber. The light emitting pump device in combination with the thulium doped fiber generates a first amplification pump wavelength and the Raman amplifier receives the first amplification pump wavelength. The first pump wavelength amplifies an optical signal in the Raman amplifier, the Raman amplifier operating at a signal wavelength in the range of about 1530 nm to about 1625 nm.

38 Claims, 6 Drawing Sheets

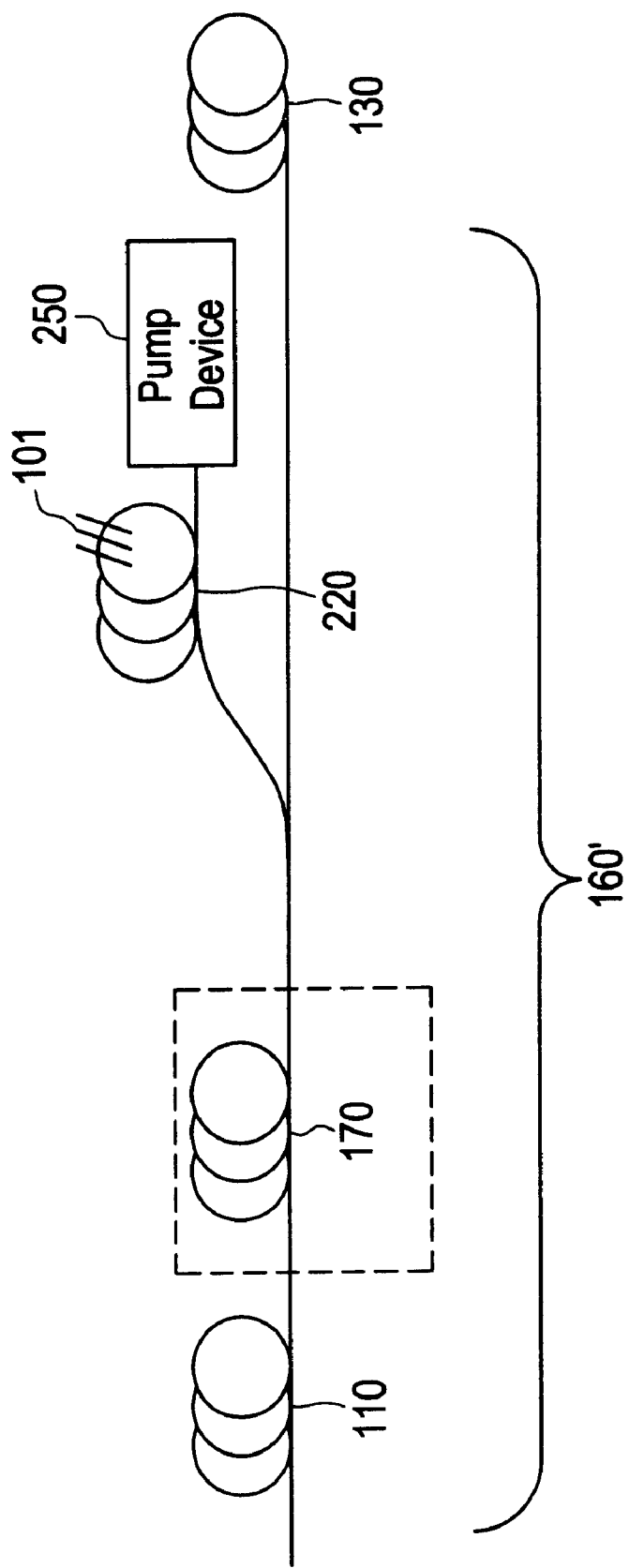

THULIUM DOPED FIBER PUMP FOR PUMPING RAMAN AMPLIFIERS

BACKGROUND OF THE INVENTION

1. Field of the Invention

The invention relates generally to optical transmission systems and, more particularly, to fiber laser pumps for Raman amplifiers.

2. Background of the Invention

Presently, optical transmission systems are being utilized to transport voice and/or data packets between various locations. As optical signal propagates along an optical fiber, the optical signal power degrades at a rate of about 0.2 db per km. Consequently, optical transmission systems employ a variety of optical amplifiers to amplify optical signal power propagating along the optical fiber. Raman amplifiers, for example, are a commonly used type of optical amplifiers.

There are two main Raman amplifier configurations, distributed Raman amplifiers and discrete Raman amplifiers. Discrete Raman amplifiers typically amplify an optical signal power within a generally small section of specially designed amplification fiber, such as high delta or dispersion compensating fiber packaged together with an optical pump device. A relatively small section (typically smaller than 1 km) of transmission fiber may also be utilized.

Distributed Raman amplifiers amplify optical signal power within a transmission fiber itself. More specifically, the distributed Raman amplifier utilizes a long length (about 100 km) of transmission fiber directly coupled to a pump source. The pump source generates a pump wavelength, which is used to amplify optical signal power propagating along the optical transmission fiber in a signal wavelength band. The amplified signal wavelength band is longer than pump wavelength, by approximately 13 THz.

A need exists for a Raman pump laser that can be utilized to efficiently amplify optical signal in the range of about 1525 nm to about 1625 nm, i.e., the low wavelength loss window currently utilized by the C and L bands of erbium doped fiber amplifiers (EDFAs).

SUMMARY OF THE INVENTION

The present invention relates to the utilization of thulium doped fiber lasers as pump lasers in Raman amplifiers for amplification of signals in the wavelength range traditionally covered by the C and L bands of EDFAs.

According to one embodiment of the present invention, an optical transmission system comprises: a Raman amplifier including (i) a rare earth doped optical fiber laser; (ii) a light emitting pump device optically coupled to the thulium doped fiber laser, and (iii) a Raman amplifier fiber optically coupled to the rare earth doped optical fiber laser. The light emitting pump device, in combination with the rare earth doped fiber, generates a first amplification pump wavelength received by the Raman amplifier. The first amplification pump wavelength amplifies an optical signal in the Raman amplifier.

According to one embodiment of the present invention, the rare earth fiber is a thulium doped, single mode, double clad fiber including a thulium doped core glass, an inner surrounding layer of clad glass having a lower refractive index than the core glass, and an outer surrounding layer of clad glass having a lower refractive index than the inner surrounding layer of clad glass. Preferably, the double clad fiber is pumped with light in the range of about 780 nm to 830 nm. More preferably, the double clad fiber is pumped with a broad area diode that pumps the inner cladding of the double clad fiber.

According to one embodiment of the present invention, the thulium doped optical fiber is a single clad fiber that includes a thulium doped core glass and a surrounding layer of clad glass having a lower refractive index than the core glass. Preferably, the single clad fiber is pumped at a wavelength of from about 1000 nm to about 1060 nm by a light-emitting device.

According to one embodiment of the present invention, a method of amplifying an optical signal in a Raman amplification system includes the steps of providing a thulium doped optical fiber, generating a first Raman pump wavelength in the thulium doped optical fiber, and pumping a Raman amplifier fiber with the first Raman pump wavelength. The first amplification pump wavelength provides Raman amplification of an optical signal having a wavelength in the range of from about 1530 nm to about 1625 nm. Preferably, a second Raman pump wavelength is provided by the thulium doped optical fiber to broaden the optical signal bandwidth over which reasonably flat gain can be achieved.

According to one embodiment of the present invention, an optical amplifier includes a thulium doped optical fiber and one or more low power seed sources optically coupled to the thulium doped optical fiber, for generating one or more Raman pump wavelengths in the range 1430 nm to 1530 nm. It is preferable that these seed sources provide an optical output power of less than 100 mW, and more preferable that this optical power be between 100 mW and 50 mW.

According to one embodiment of the present invention, the operating wavelengths of the thulium fiber laser are selected by fiber Bragg gratings optically coupled to the thulium doped optical fiber. The operating wavelengths are optically coupled to the Raman amplifier fiber.

According to one embodiment of the present invention, an optical transmission system comprises a Raman amplifier that includes a thulium doped optical fiber, a light emitting pump device optically coupled to the thulium doped optical fiber, and a Raman amplifier fiber optically coupled to the thulium doped optical fiber and receiving at least two different pump wavelengths. The light emitting pump device in combination with the thulium doped optical fiber generates at least two different pump wavelengths. These two different pump wavelengths amplify an optical signal in the Raman amplifier fiber. The Raman amplifier operates at a signal wavelength in the range of about 1530 nm to about 1625 nm. Preferably, the magnitude of each of the at least two different pump wavelengths is adjusted to provide different magnitudes of amplification over the signal wavelength range of the Raman amplifier and to allow for power flow due to Raman gain from the shorter pump wavelength to the longer pump wavelength.

BRIEF DESCRIPTION OF THE DRAWINGS

The foregoing advantages and features of the invention will become apparent upon reference to the following detailed description and the accompanying drawings, of which:

FIG. 2b is a schematic diagram of the index profile of the Tm doped optical fiber of FIG. 2a.

FIG. 3 is a schematic diagram of a third embodiment of an optical transmission system according to the present invention.

DETAILED DESCRIPTION OF SPECIFIC EMBODIMENTS

Figure 1A:
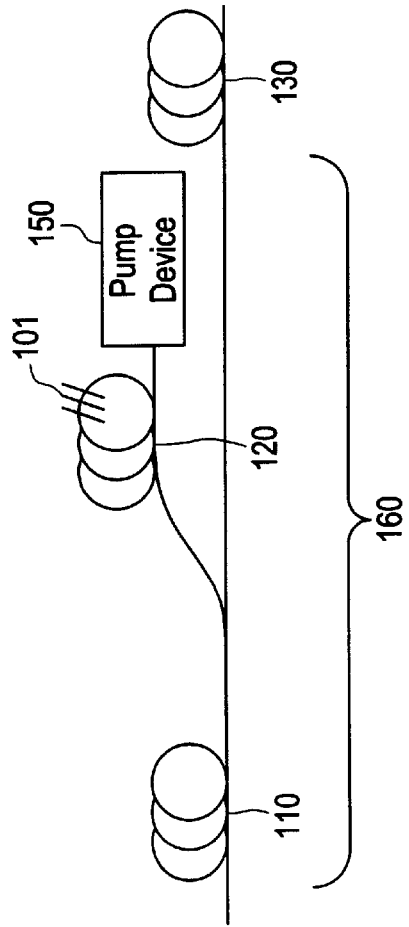
FIG. 1a is a schematic diagram of a first embodiment of an optical transmission system according to the present invention.

A first embodiment of an optical transmission system according to the present invention is shown by the block diagram of FIG. 1a. As depicted in FIG. 1a, an optical signal S propagates through the transmission optical fiber 110 of the Raman fiber amplifier 160 where the optical signal undergoes Raman amplification. The amplified signal is then coupled into transmission optical fiber 130. Thus, the transmission fiber 110 constitutes Raman amplifier fiber. The Raman amplifier 160 (distributed Raman amplifier) thus includes the optical transmission fiber 110 (50 km to 125 km in length) and an optical pump device 115 coupled to the transmission fiber 110. The optical pump device 115 includes a light emitting device 150 and a thulium doped fiber 120. In particular, the light emitting device (also referred to as a primary pump device) 150 generates energy which is converted to optical pump power (of at least one Raman pump wavelength $\lambda_p$ in thulium (Tm) doped optical fiber 120 (also referred to herein as a Raman pump source) and subsequently optically coupled to the to transmission fiber 110.

Figure 1B:
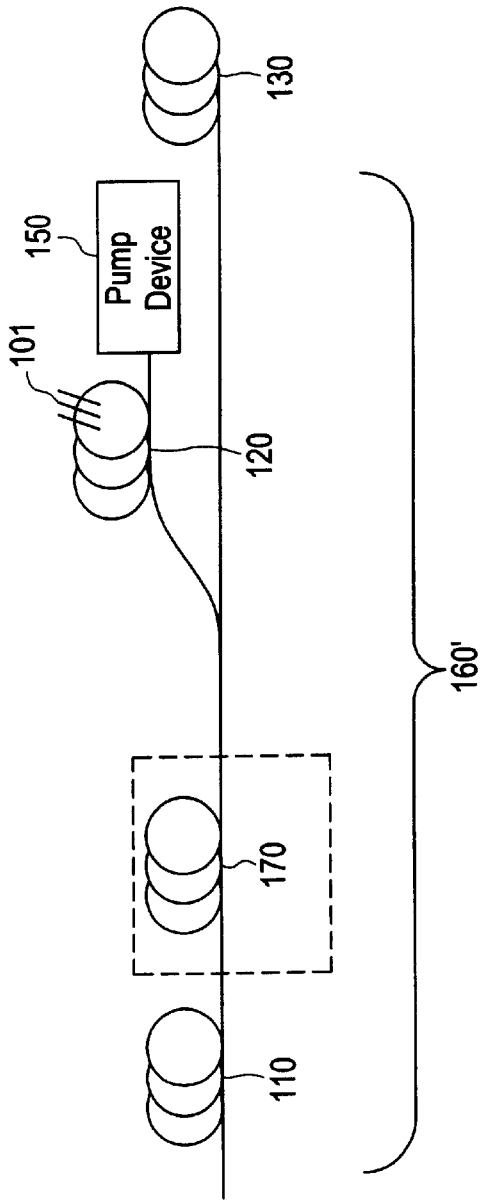
FIG. 1b is a schematic diagram of a second embodiment of an optical transmission system according to the present invention.

Alternatively, discrete Raman amplification may also be utilized. This may be done, for example, in conjunction with distributed Raman amplification. As depicted in FIG. 1b, the Raman fiber amplifier 160' amplifies the optical signal propagating through the optional optical fiber 170 (providing discrete Raman amplification), and also provides Raman amplification along transmission optical fiber 110 (i.e., distributed Raman amplification). Thus, optical fiber 170 also constitutes Raman amplifier fiber. The optional fiber 170 is coiled and has a length of less than 2 km, preferably less than 1 km and more preferably less than 500 m. In this embodiment, both discrete and distributed Raman amplification is enabled by the optical pump device 115. The optical pump device 115 includes a light emitting device 150 and a thulium doped fiber 120, as described above, and is optically coupled to the optical fiber 170. Upon exiting optical fiber 170, the optical pump power provided by the pump device 115 is then provided to the transmission fiber 110.

The Raman pump wavelength $\lambda_p$ provided by the Tm doped fiber 120 propagates through the optional optical fiber 170 in a direction opposite the optical signal $\lambda_s$. Energy gradually transfers from the Raman pump wavelength $\lambda_p$ (which is typically smaller than the optical signal wavelength $\lambda_s$) to the optical signal wavelength $\lambda_s$, thereby providing optical signal power amplification. At least one embodiment of the present invention the optical transmission system that amplifies optical signal wavelengths within both the C and L bands. The C band includes signal wavelengths in the 1530 nm to 1565 nm range. The L band includes signal wavelengths in the 1565 nm to 1625 nm range.

The optical fibers 110 and 130 may be any conventional optical transmission fibers that fit this application, for example LEAF® fiber or SMF-28™ fiber, available from Corning Incorporated, of Corning, N.Y. Further, the Raman amplification fiber 110,170 may be transmission fiber and/or either a high delta fiber ($\Delta n/n > 2\%$), a dispersion fiber, or a dispersion slope compensating fiber.

Figure 2A:
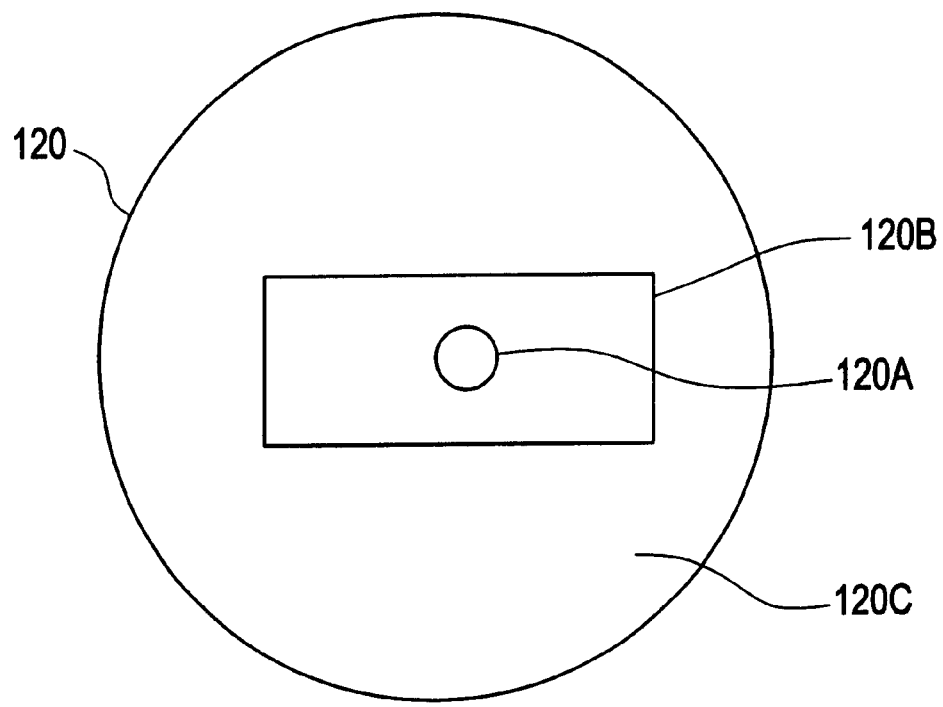
FIG. 2a is a cross sectional view of an exemplary double clad Tm doped optical fiber according to the present invention.
Figure 2B:
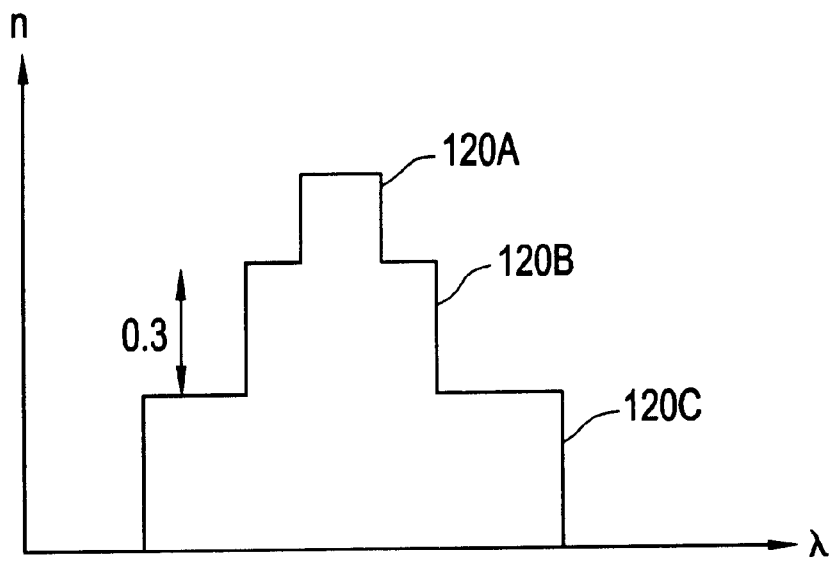

As stated above, in the first and second embodiments, the optical fiber 120 serves as a source of Raman pump power associated with the first Raman pump wavelength $\lambda_p$. The optical fiber 120 preferably has the structure shown in FIG. 2a. In particular, the optical fiber 120 is preferably a double clad optical fiber—i.e., it has Tm doped core 120a surrounded by the inner cladding 120b and the outer cladding 120c. The index of refraction of the outer cladding 120a is smaller than the index of the inner cladding, forming a high numerical aperture NA (NA>0.3) inner cladding 120b. Preferably, the numerical aperture NA between the inner cladding 120b and the outer cladding 120c is at least 0.4. This is illustrated, schematically, in FIG. 2b.

The single mode core 120a preferably includes thulium-doped silica glass for reasons which will be described below. Preferably, the thulium-doped glass core 120a further includes at least one of the following materials: antimony silicate, antimony germanate, mixed antimony silica germanate, antimony bismuth silicate, antimony bismuth germanate, tellurite, aluminate, fluorozirconate, fluoroaluminate, and fluorophosphate. As would be readily apparent to one skilled in the art, additional glass materials may also be used as a core material.

Preferably, the thulium doped glass core 120a has the highest lying phonon mode has an energy maximum of no greater than 950 cm$^{-1}$, which represents bonding interactions between the glass and the thulium (and/or any other rare earth ion dopant). These bonding interactions with rare earth ion dopants are significant to the present invention, as the inventors have found that rare earth ion dopants can be utilized to generate the Raman pump wavelengths used to amplify optical signals in both the C and L bands within the Raman amplifier 160, 160'. The phonon mode can be measured using europium Eu(III) side-band spectroscopy, a well known method in the art of rare earth element spectroscopy. More specifically, the side-band spectrum of Eu(III) is produced by coupling of the $^5D_2 \rightarrow {}^7F_0$ electron transition of trivalent europium Eu(III) to the phonon modes of the host glass. Eu(III) ions provided for testing purpose (instead of Tm) in the host glass are excited over a range of wavelengths corresponding to the $^5D_2 \rightarrow {}^7F_0$ electron transition, approximately 435 nm to 475 nm. The fluorescence is monitored at a single wavelength, approximately 612 nm, and the resulting spectrum is fluorescence intensity versus excitation wavelength. The fluorescence monitoring allows calculation of the phonon energy $E_{sb}$ (in wavenumbers/cm$^{-1}$) indicated by a side-band spectroscopy, by the following equation: $E_{sb}=10,000,000*(1/\lambda_{sb}-1/\lambda_{pk})$, where $\lambda_{sb}$ is the wavelength of the side-band and $\lambda_{pk}$ is the wavelength (measured in nm) of the peak of the $^5D_2 \rightarrow {}^7F_0$ transition, typically near 465 nm. The highest lying phonon mode is the absorption band lying at the shortest wavelength relative to the main peak.

As described above, the primary pump device 150 generates optical power at the primary pump wavelength, which is coupled to the Tm doped optical fiber 120. Pump device 150 is preferably a broad area diode. The primary pump wavelength is preferably in the range of about 780 nm to about 830 nm, and more preferably at about 800 nm. The primary pump wavelength(s) excite low level electrons in the Tm ions and enable gain within the Tm doped optical fiber 120 in the range of about 1430 nm to about 1520 nm, thereby producing the Raman pump wavelength λp. That is, as excited electrons transition from an excited energy level to a non-excited energy level, photons are emitted by the ions, thereby generating the Raman pump wavelength λp. By pumping the Raman amplifier 160 with the Raman pump wavelength λp in the range of about 1430 nm to about 1520 nm, the Raman amplifier 160 amplifies an optical signal at a wavelength in the range of about 1530 nm to about 1625 nm.

The inventors have found that co-lasing (i.e. lasing at two or more different wavelength) on the $^3F_4$ to ground state can be utilized to improve the power conversion efficiency of the Raman pump wavelength generation. Co-lasing depletes the lower energy levels of the desired transition. Specifically, the $^3F_4$ energy level of the transition from about 800 nm to about 1430 nm–1520 nm for Tm ions is metastable (e.g., a transient state of an excited ion). Thus, the laser power conversion efficiency can be improved by co-lasing the Tm doped optical fiber 120 at a second wavelengths in the range of about 1650 nm to about 2000 nm and, preferably, at about 1800 nm. This additional lasing wavelength depletes the $^3F_4$ energy level of the Tm ions.

Furthermore, Tm doped optical fiber may also include acceptor ions, for example, trivalent terbium and the depopulation of $^3F_4$ level would occur by energy transfer to such acceptor ions.

The inventors have found that co-lasing can be achieved by incorporating an optical element 101, such as dielectric mirrors and/or fiber gratings with the appropriate wavelength and bandwidth, into the optical fiber 120 as is illustrated, for example, in FIGS. 1*a* and 1*b*. Raman pump wavelengths λp provided by the Tm doped fiber are selected by the reflectance wavelengths of the optical element(s) 101. The optical pump power produced by the Tm doped fiber is then coupled to the optical fiber 170 and/or 110 to provide optical signal amplification.

Thus, an optical transmission system according to the first and second embodiments of the present invention provides amplification for at signal wavelengths in the wavelength range of about 1530 nm to about 1625 nm. As described above, these embodiments utilize a primary pump device 150 in combination with Tm doped optical fiber 120 to generate the Raman pump wavelength λp. Because Tm doped fiber 120 can lase at different wavelengths within a range of 1430 nm–1520 nm (which are suitable for pumping both the C and L band amplifiers), one can select the appropriate pump wavelengths by selecting, for example, the appropriate cavity length (for example, by choosing the length of Tm doped fiber), or dielectric mirror reflectance. Utilizing different Raman pump wavelengths λp can then be used to produce Raman amplification in both C and L bands. Thus, the optical signal bandwidth range of the Raman amplifier can be expanded or configured to meet the desired specifications of a particular system.

A third embodiment of an optical transmission system according to the present invention is shown schematically in FIG. 3. This third embodiment is similar to the second embodiment, except the primary pump device 150 and the thulium doped optical fiber 120 are replaced with the primary pump device 250 and thulium doped optical fiber 220. The pump device 250 and optical fiber 220 generate Raman pump wavelength for amplification of optical signals in the wavelength range of about 1530 nm to about 1625 nm.

Figure 4:
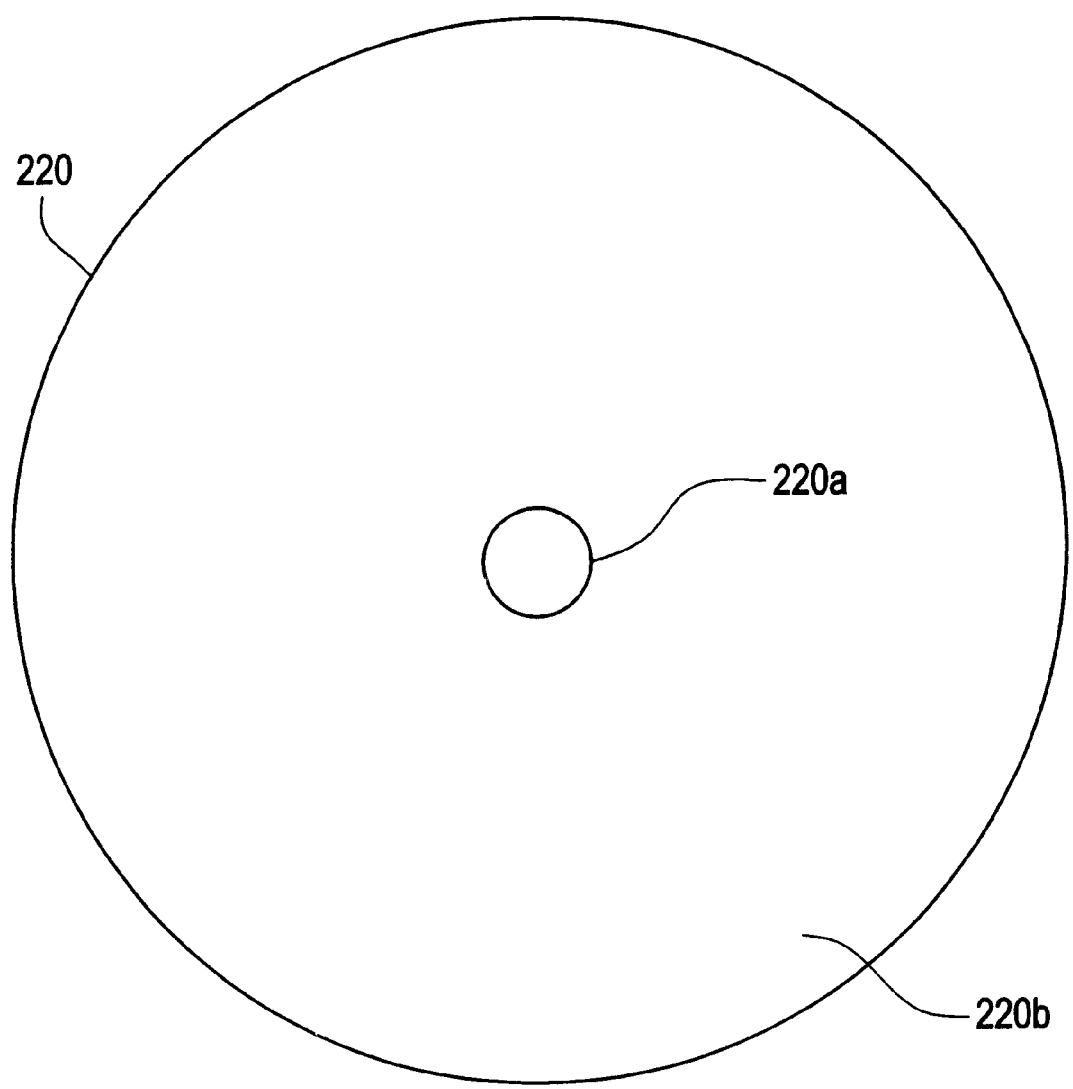
FIG. 4 is a schematic illustration of a cross section of an exemplary single clad Tm doped optical fiber.

Preferably, the Tm doped optical fiber 220 is a single-clad Tm doped fiber, as shown in FIG. 4. Unlike the double-clad Tm doped fiber of the first and second embodiments, the single-clad Tm doped fiber 220 of the third embodiment has a core 220*a* surrounded by only one layer of cladding 220*b*. The cladding glass has a lower refractive index than the core glass. The single-clad Tm doped fiber 220 promotes lower energy level depopulation of the Tm doped ions by the pump device 250, thereby generating the Raman pump wavelength with improved efficiency without requiring a co-lasing scheme, as described below.

According to the third embodiment of the present invention, the primary pump device 250 is preferably a double-clad Yb or Nd fiber laser or a diode pumped Nd:YAG or YLF (Yttrium Lanthanum Fluoride) solid state laser. The primary pump device 250 pumps the optical fiber 220 at a wavelength in the range of about 1000 nm to about 1060 nm, preferably about 1060 nm, to enable gain within the Tm doped optical fiber 220 in the range of about 1430 nm to about 1530 nm, producing Raman amplification pump wavelength λp.

Figure 5:
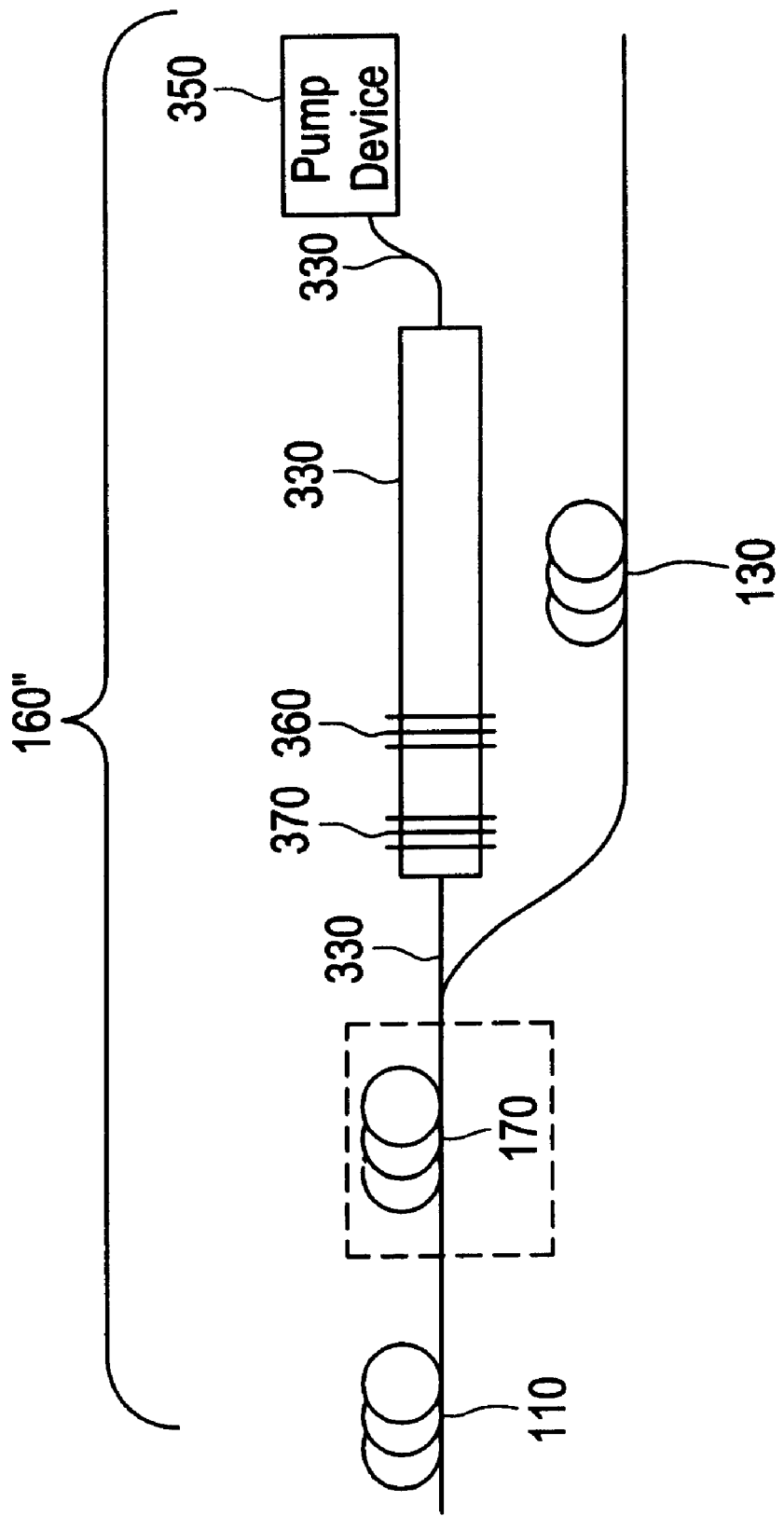
FIG. 5 is a schematic diagram of a fourth embodiment of an optical transmission system having a laser cavity with at least two output gratings according to the present invention.

A fourth embodiment of an optical transmission system according to the present invention is shown schematically in FIG. 5. The fourth embodiment is similar to the second embodiment, except the pump device 150 and optical fiber 120 are replaced with a light emitting pump device 350, coupled to a laser cavity 330 of a thulium doped optical fiber. The laser cavity 330 includes two or more output fiber Bragg gratings 360 and 370, enabling dual wavelength pumping of the Raman amplifier 160. More specifically, in this embodiment, the laser cavity 330 incorporates two output Bragg gratings that select two different output Raman pump wavelengths. Both pump wavelengths are obtained simultaneously from the same laser cavity 330, and both wavelengths are utilized to pump a discrete and/or distributed Raman amplifier. This eliminates the need for multiplexing two diode laser pumps at different wavelengths to obtain broad band Raman amplification. For example, pumping with Raman wavelength generated at 1430 nm and 1440 nm results in broad Raman amplification in the C-band. Dual wavelength pumping (i.e. pumping at different wavelengths) allows a wider range of optical signals to be effectively amplified by the Raman amplifier 160, as each wavelength individually provides Raman amplification for a corresponding band of signals. Due to the inherently strong power transfer between the C and L band pump wavelengths, the optical communication system may be designed to have higher power at the C band pump wavelength as some of the energy will inherently transfer from the C band pump wavelength to the L band pump wavelength. The amount of energy transfer will depend directly on the channel loading condition and on signal and pump power profiles used in the C-band.

As would be readily apparent to one skilled in the art, additional output gratings with a corresponding number of additional pump wavelengths may be implemented to provide additional Raman wavelength pumping (i.e., more than two pump wavelength) of the Raman amplifier. The particular arrangement of the output fiber Bragg gratings 360 and 370 shown is exemplary, other arrangements may also be utilized. For example, a fiber pigtail may include the grating, or alternatively, a dielectric mirror may be connected to the thulium doped optical fiber to select the dual wavelengths being pumped into the Raman amplifier 160.

An optical communication system according to this fourth embodiment has all of the aforementioned advantages of the first and second embodiments, and further provides for adjustability of the desired output gain shape and a wider gain bandwidth than conventional transmission systems. If the gratings 360 and 370 are tunable, the reflection wavelengths of the output gratings 360 and 370 can be dynamically adjusted relative to the gain shape to achieve the desired output gain shape. Further, the use of at least two pump wavelengths can be implemented to provide amplification in a wider portion of both the C and L bands simultaneously, thereby providing a wider signal gain bandwidth than the conventional transmission systems.

Figure 6:
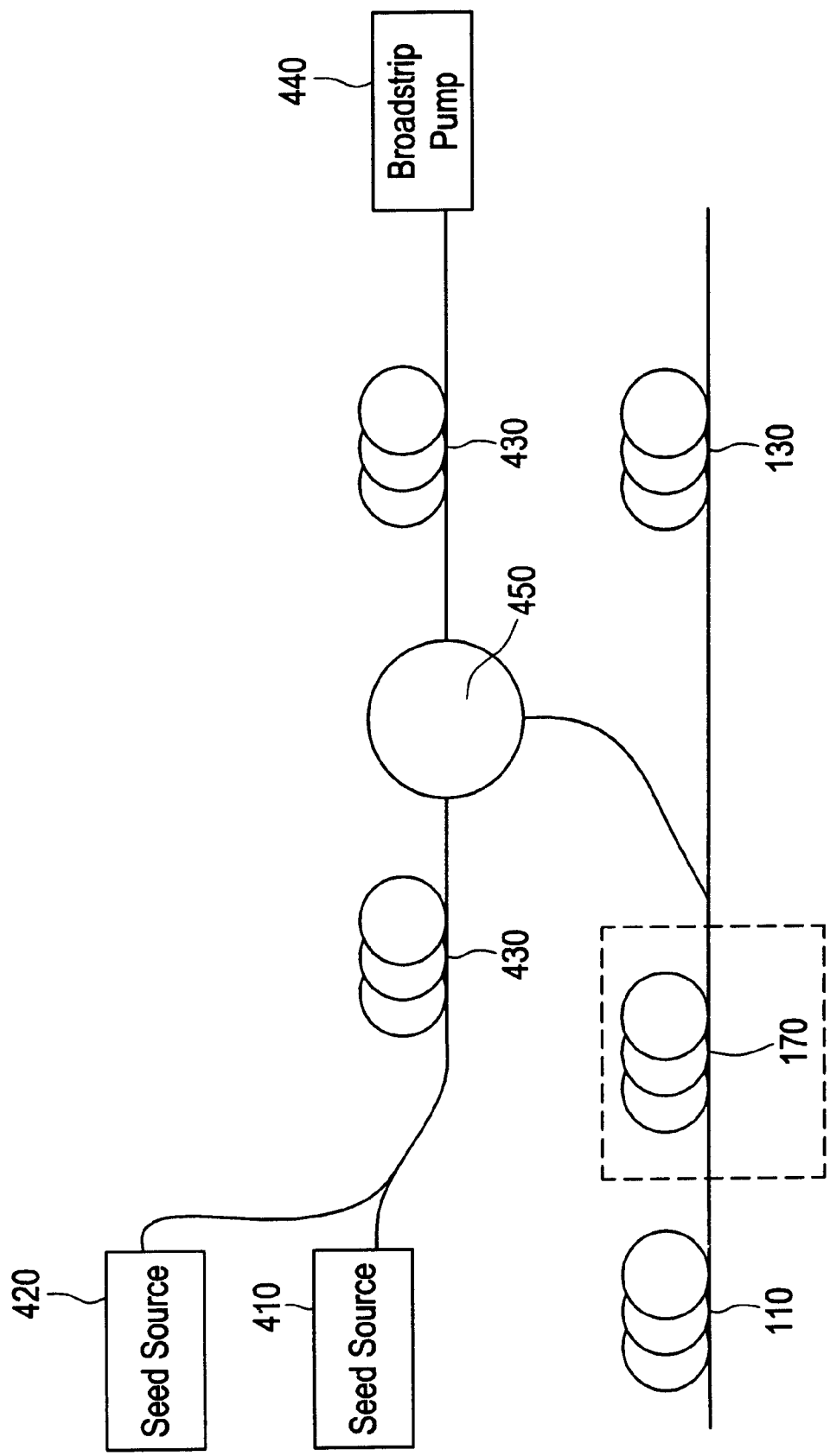
FIG. 6 is a schematic diagram of a fifth embodiment of an optical transmission system with at least one seed source according to the present invention.

A fifth embodiment of an optical transmission system according to the present invention is shown schematically in FIG. 6. This fifth embodiment is similar in many respects to the second embodiment, except the pump device 150 and the Tm doped optical fiber 120 are replaced with the broad area pump device 450 (for, example, a broad area diode), the pump seed sources 410 and 420, and two Tm doped optical fiber coils 430. The first Tm doped optical fiber 430 is pumped by the low power pump seed source 410 having a wavelength in the range of about 1430 nm to about 1475 nm, which generates an Raman pump wavelength in the same range (i.e., 1430 nm to 1475 nm) in order to amplify the C-band signals in Raman amplifier 160. In order to increase the amplification bandwidth, the second pump seed source 420 having wavelength in the range of about 1475 nm to 1530 nm is also coupled to the first Tm doped optical fiber coil 430, which generates Raman pump wavelength in the same range (i.e., 1475 nm to 1530 nm) to amplify signals in the L band in Raman amplifier 160. In order to improve efficiency of the transition between the first and second seed wavelengths and the first and second amplification wavelengths the second Tm doped fiber coil 430 may be pumped via the broad area pump device 440, preferably at a primary pump wavelength of about 800 nm.

According to this fifth embodiment, the optical pump seed sources may be, for example, Tm doped fiber amplified spontaneous emission sources or inexpensive superluminescent diodes. As aforementioned, due to the higher Tm gain and the aforementioned C to L band power transfer, the second pump seed source 420 does not have to be as high of power as the first pump seed source 410. Preferably, the low power pump seed source 410 has an output power in the range of about 10 mW to about 50 mW and the second pump seed source 420 has the output power in the range of 100 mW to 500 mW. As would be readily apparent to one skilled in the art, any number of additional pump seed sources may be added to further expand the gain bandwidth or to provide additional gain to specific wavelengths.

An optical communication system according to this fifth embodiment has all of the aforementioned advantages of the first embodiment, and further allows for simple bandwidth upgradability and applications involving forward Raman pumping (e.g., Raman amplification along an output optical fiber). The gain bandwidth of the fifth embodiment can be widened or customized by adding additional seed sources to provide additional Raman wavelengths. Further, amplified spontaneous emission (ASE) sources including pump seed sources 410 and 420 typically have much lower relative intensity noise (RIN) than conventional lasers. The RIN noise amplifies ambient noise along with the optical signal wavelengths, preventing conventional Raman amplification schemes from being used in forward Raman amplification applications. Due to the lower ASE (Amplified Spontaneous Emission) of pump seed sources and corresponding lower RIN noise, the present invention can thus be used for forward Raman pumping implementations where conventional Raman systems could not. At least one gain flattening filter may be implemented at about a midpoint of transmission fiber to shape the source spectral characteristics according to the system channel plan to adjust the forward Raman amplification.

Thus, an optical communication system with improved amplification bandwidth has been described according to the present invention. Many modifications and variations may be made to the techniques and structures described and illustrated herein without departing from the spirit and scope of the invention. Accordingly, it should be understood that the methods and apparatus described herein are illustrative only and are not limiting upon the scope of the invention.

What is claimed is:

1. An optical transmission system including a Raman amplifier, said Raman amplifier comprising:

a thulium doped optical fiber;

a light emitting pump device optically coupled to said thulium doped fiber, said light emitting pump device in combination with said thulium doped fiber generating a first amplification pump wavelength; and a Raman amplifier fiber optically coupled to said thulium doped optical fiber and receiving the first amplification pump wavelength, wherein said first amplification pump wavelength amplifies an optical signal in the Raman amplifier, said Raman amplifier operating at a signal wavelength in the range of about 1530 nm to about 1625 nm.

2. The system of claim 1, wherein the thulium doped optical fiber is a double clad fiber comprising:

a thulium doped core glass;

an inner surrounding layer of clad glass having a lower refractive index than said core glass; and an outer surrounding layer of clad glass having a lower refractive index than said inner surrounding layer of clad glass.

3. The system of claim 2, wherein the first amplification pump wavelength is in the range of about 1430 nm to about 1520 nm.

4. The system of claim 2, wherein the light emitting device provides a pump wavelength of from about 780 nm to about 830 nm.

5. The system of claim 2, wherein said double clad fiber is pumped with light in the range of about 1380 nm to 1470 nm.

6. The system of claim 4, wherein the light emitting device is a broad area diode that pumps an inner cladding of the double clad fiber.

7. The system of claim 2, wherein the numerical aperture between the inner and outer clads is at least 0.3.

8. The system of claim 1, wherein the optical fiber is a single-clad fiber comprising: a thulium doped core glass; and a surrounding layer of clad glass having a lower refractive index than said thulium core glass.

9. The system of claim 8, wherein said doped optical fiber is pumped at a wavelength of from about 1000 nm to about 1060 nm by said light emitting pump device.

10. The system of claim 1, wherein the Raman amplifier comprises a distributed Raman amplifier.

11. The system of claim 1, wherein the Raman amplifier comprises a discrete Raman amplifier.

12. The system of claim 6, further comprising at least one optical element that provides for co-lasing of the fiber at about 1650 nm to about 2000 nm so as to depopulate the $^3F_4$ energy level of the fiber.

13. The system of claim 12, wherein the optical element is a dielectric mirror.

14. The system of claim 12, wherein the thulium doped optical fiber further comprises an acceptor ion, and depopulation of the $^3F_4$ energy level of the fiber occurs by energy transfer to the acceptor ion.

15. The system of claim 14, wherein the acceptor ion is trivalent terbium.

16. The system of claim 1, wherein the optical fiber comprises a thulium-doped glass core comprising at least one of antimony silicate, antimony germanate, mixed antimony silica germanate, antimony bismuth silicate, antimony bismuth germanate, tellurite, aluminate, fluorozirconate, fluoroaluminate, and fluorophosphate.

17. The system of claim 1, wherein the optical fiber comprises a thulium-doped core in which the peak maximum of the highest lying phonon mode is no greater than 950 cm$^{-1}$.

18. The system of claim 1, wherein the optical fiber comprises a thulium-doped Sb/silicate glass core.

19. The system of claim 1, wherein the thulium doped optical fiber comprises a fluorophosphate.

20. The system of claim 1, wherein the thulium doped optical fiber further outputs a second amplification pump wavelength.

21. The system of claim 20, wherein the first amplification pump wavelength and second amplification pump wavelength are selected by fiber Bragg gratings disposed in the thulium doped optical fiber or a fiber pigtail connected said thulium doped optical fiber.

22. The system of claim 20, wherein the first amplification pump wavelength and second amplification pump wavelength are selected by a dielectric mirror optically coupled to the thulium doped optical fiber.

23. The system of claim 20, wherein the first amplification pump wavelength and second amplification pump wavelength are generated by injection of low power seed sources in the range of 50 mW to 100 mW, said seed sources being optically coupled to the thulium doped optical fiber.

24. The system of claim 20, wherein the light emitting device comprises at least one of a superluminescent diode and a Thulium doped fiber amplified spontaneous emission source.

25. The system of claim 1, further comprising a gain shaping filter.

26. The system of claim 1, wherein the fiber is a Thulium doped fiber laser (TDFL), and wherein the TDFL includes two or more output gratings.

27. A method of amplifying an optical signal in a Raman amplification system, comprising the steps of:

providing a thulium-doped optical fiber;

generating a first amplification pump wavelength in the fiber; and pumping a Raman amplifier with the first amplification pump wavelength, wherein the first amplification pump wavelength provides Raman amplification of an optical signal having a wavelength in the range of from about 1530 nm to about 1625 nm.

28. The method of claim 27, further comprising the step of:

generating a second amplification pump wavelength.

29. The method of claim 28, wherein the steps of generating a first amplification pump wavelength and generating a second amplification pump wavelength are performed by fiber Bragg gratings.

30. The method of claim 28, wherein the steps of generating a first amplification pump wavelength and generating a second amplification pump wavelength are performed by coupling of low power optical pump seed sources to said thulium doped fiber.

31. The method of claim 27, further comprising the step of: depopulating the $^3F_4$ energy level of the fiber.

32. An optical amplifier comprising:

a thulium doped optical fiber;

a low power pump seed source optically coupled to said thulium doped optical fiber for generating a first amplification pump wavelength and a second amplification pump wavelength; and a Raman amplifier receiving the first and second amplification pump wavelengths, wherein the first amplification pump wavelength has a wavelength of from about 1455 nm to about 1465 nm, and wherein said second amplification pump wavelength has a wavelength of about 1530 nm to about 1625 nm.

33. The optical amplifier according to claim 32, wherein said second amplification wavelength is in the range of 1480 nm to 1500 nm.

34. An optical amplifier comprising:

a thulium doped optical fiber;

a pump light emitting device optically coupled to the fiber for generating a first amplification pump wavelength and a second amplification pump wavelength;

a fiber Bragg grating optically coupled to the fiber for selecting the first amplification pump wavelength and the second amplification pump wavelength; and a Raman amplifier fiber receiving the first and second amplification pump wavelengths.

35. An optical transmission system including a Raman amplifier, said Raman amplifier comprising:

a thulium doped optical fiber;

a light emitting pump device optically coupled to said thulium doped fiber, said light emitting pump device in combination with said thulium doped fiber generating at least two different pump wavelengths; and a Raman amplifier fiber optically coupled to said thulium doped optical fiber and receiving the at least two different pump wavelengths, wherein said at least two different pump wavelengths amplify an optical signal in the Raman amplifier, said Raman amplifier operating at a signal wavelength in the range of about 1530 nm to about 1625 nm.

36. The optical transmission system of claim 35, wherein the magnitude of each of the at least two different pump wavelengths is adjusted to provide different magnitudes of amplification within said Raman amplifier at said at least two different pump wavelengths.

37. A Raman amplifier comprising:

a rare-earth doped optical fiber;

a light emitting pump device optically coupled to said rare-earth doped fiber, said light emitting pump device in combination with said rare earth doped fiber generating a first amplification pump wavelength; and a Raman amplifier fiber optically coupled to said rare earth doped optical fiber and receiving the first amplification pump wavelength, wherein said first amplification pump wavelength amplifies an optical signal in the Raman amplifier.

38. The Raman amplifier according to claim 37, wherein said light emitting pump devise a in combination with said rare earth fiber generates a second amplification pump wavelength simultaneously with said first amplification pump wavelength.

* * * * *